United States Patent [19]
Yamamoto et al.

[11] Patent Number: 6,080,599
[45] Date of Patent: Jun. 27, 2000

[54] SEMICONDUCTOR OPTOELECTRIC DEVICE AND METHOD OF MANUFACTURING THE SAME

[75] Inventors: Masahiro Yamamoto, Sagamihara; Hidetoshi Fujimoto, Kawasaki; Yoshihiro Kokubun, Yokohama; Masayuki Ishikawa, Yokohama; Shinji Saito, Yokohama; Yukie Nishikawa, Narashino; John Rennie, Tokyo, all of Japan

[73] Assignee: Kabushiki Kaisha Toshiba, Kawasaki, Japan

[21] Appl. No.: 09/089,130

[22] Filed: Jun. 2, 1998

Related U.S. Application Data

[62] Division of application No. 08/623,829, Mar. 29, 1996, Pat. No. 5,864,171.

[30] Foreign Application Priority Data

Mar. 30, 1995 [JP] Japan ..................................... 7-072678
Sep. 13, 1995 [JP] Japan ..................................... 7-235802

[51] Int. Cl.[7] .......................... H01L 33/00; H01L 21/86; H01L 21/786
[52] U.S. Cl. ........................ 438/33; 438/113; 438/460; 438/973; 438/975
[58] Field of Search .................... 438/32, 33, 68, 438/113, 114, 458, 460, 462, 973, 975; 708/386, 387; 257/77, 94, 99, 627

[56] References Cited

U.S. PATENT DOCUMENTS

| | | |
|---|---|---|
| 3,816,906 | 6/1974 | Falckenberg . |
| 4,225,892 | 9/1980 | Bassett et al. .......................... 360/113 |
| 4,542,397 | 9/1985 | Biegelsen et al. . |
| 4,912,064 | 3/1990 | Kong ........................................ 438/33 |
| 5,006,908 | 4/1991 | Matsuoka ................................ 257/76 |
| 5,187,547 | 2/1993 | Niina et al. .............................. 257/77 |
| 5,218,216 | 6/1993 | Manabe et al. ........................ 257/103 |
| 5,341,024 | 8/1994 | Rosotker . |
| 5,585,648 | 12/1996 | Tischler ................................... 438/32 |
| 5,587,593 | 12/1996 | Koide et al. . |

FOREIGN PATENT DOCUMENTS 49-134271  12/1974  Japan .

*Primary Examiner*—Mary Wilczewski
*Assistant Examiner*—Yung A. Lin
*Attorney, Agent, or Firm*—Oblon, Spivak, McClelland, Maier & Neustadt, P.C.

[57] ABSTRACT

The present invention is intended to provide a semiconductor optoelectric device with high luminescent efficiency and a method of manufacturing the same. The semiconductor optoelectric device 18 according to the present invention is constructed by depositing compound-semiconductor layers 13 and 14 on a monocrystalline substrate 11 of a hexagonal close-packed structure. The shape of the monocrystalline substrate 11 is a parallelogram. Individual sides of the parallelogram are parallel to a <11-20> orientation. As the monocrystalline substrate, sapphire, zinc oxide or silicon carbide may be used. As the compound-semiconductor layers, an n-type GaN layer 13 and p-type GaN layer 14 may be used.

21 Claims, 8 Drawing Sheets

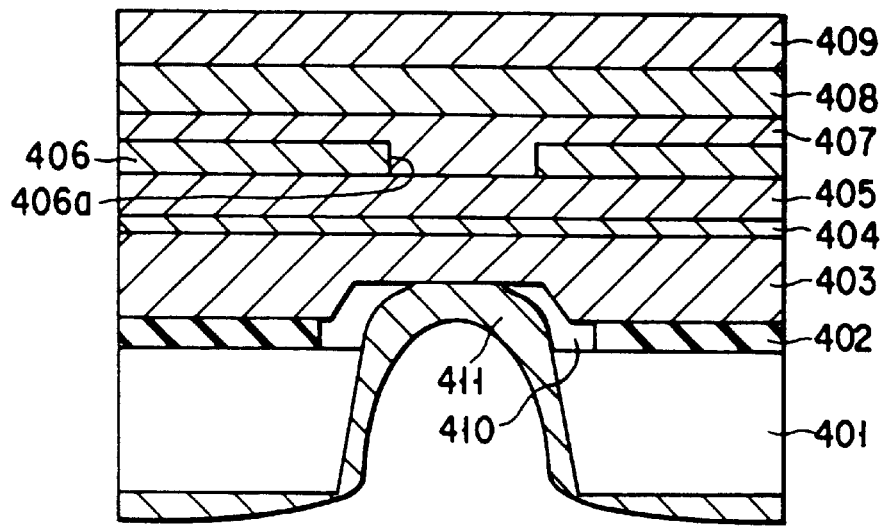
F I G. 23
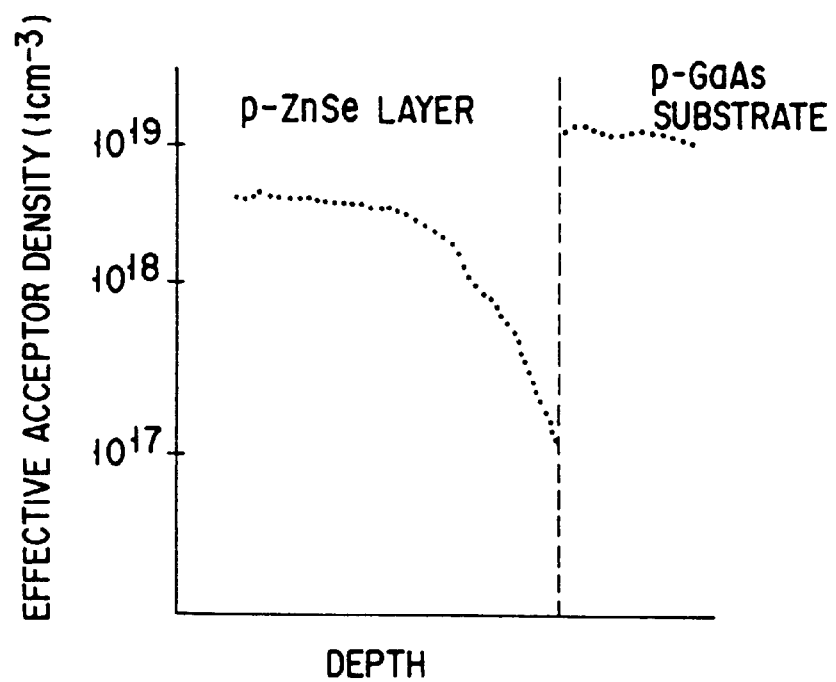
F I G. 24

SEMICONDUCTOR OPTOELECTRIC DEVICE AND METHOD OF MANUFACTURING THE SAME

This application is Division of application Ser. No. 08/623,829 filed on Mar. 29, 1996, now U.S. Pat. No. 5,864,171.

BACKGROUND OF THE INVENTION

1. Field of the Invention

The present invention relates to a semiconductor optoelectric device and a method of manufacturing the same.

2. Description of the Related Art

Semiconductor optoelectric devices such as light emitting diodes (LED) and laser diodes (LD) are usually manufactured as follows. The deposition layers, such as GaAs, InGaP, GaAlAs, were grown in an epitaxial growth system on a substrate made of GaAs or GaP having a zinc blend structure by metal organic chemical vapor deposition (MOCVD) or molecular beam epitaxial growth (MBE) or both. The substrate thus obtained is cut into chips, thereby obtaining semiconductor optoelectric devices.

The substrate on which semiconductor layers are deposited is cleaved after scribe lines are provided on the substrate by use of a needle scriber. Since the substrate having a zinc blende structure possesses a natural cleavage line of cutting in a <110> orientation, it can be easily cut into chips along the scribe lines extending in the <110> orientation.

Recently, as a material for a semiconductor optoelectric device emitting at a short-wavelength including blue light, gallium nitride based materials represented by GaN has attracted attention. When the gallium nitride based material is used in manufacturing a semiconductor optoelectric device, a sapphire substrate is usually employed. The sapphire substrate is diced by a disc cutter or cut after the scribing lines are provided. The resultant semiconductor chips are usually a square or rectangular.

However, sapphire having a hexagonal close-packed structure does not distinctly have such a natural cleavage line as the zinc blende structure has. Therefore, an excessive force must be applied to dice or cut the sapphire substrate along the scribe lines, unlike in the case of the substrate having a zinc blende structure. The excessive force applied to the sapphire substrate imposes an undesirable influence on performance of the semiconductor optoelectric devices, lowering the yield of the diode. For example, the excessive force degrades crystallizable of the epitaxial layers on sapphire substrate, ultimately decreasing the luminescence efficiency. Attempts have been made to manufacture a laser diode by using a sapphire substrate. However, they failed, since it was not possible to cleave the sapphire substrate into chips in mirror-like flat planes, a requisite feature for manufacturing a laser diode. Accordingly, it still remains difficult to produce laser diodes from the hexagonal close-packed structure crystalline substrate.

On the other hand, a compound-semiconductor made of a group II-VI element such as ZnSe has attracted attention as a material for a visual-light emitting diode. This is because it has a bandgap equal to or more than the energy corresponding to visible-light, blue or green wavelength. The group II-VI compound-semiconductor is advantageous since it has an wavelength in a short wavelength range covering blue to ultraviolet, unlike a compound-semiconductor of a group III-V element (GaAlAs or InGaAlP) employed in conventional laser diodes and LEDs, has an operating wavelength range on the longer wavelength side of green. Furthermore, the group II-VI compound-semiconductor is also advantageous since it can achieve the same results as those of conventional semiconductor optical devices such as, small, light, low-voltage operational ability and high reliability. By virtue of these advantages, the group II-VI compound-semiconductor is expected to be used in a high-density optical disk and a full-color display of an open-air message board.

As a blue-green light emitting diode using the group II-VI element such as ZnSe, a current-injection type laser diode is known to be operated at room temperature. As is reported in OKUYAMA et al., Electronics Letters Vol. 29, No. 16, pp. 1488–1489 (1993), the group II-VI compound-semiconductor such as ZnSe grain on a GaAs substrate in accordance with the MBE (molecular beam epitaxial growth) method, the blue-green laser diode is formed.

However, no practical laser diode capable of being operated at a low voltage and having a long-life and high luminescence efficiency, have been achieved. This is because, (a) It is difficult to make the II-VI family compound-semiconductor lattice-match with a substrate made of a different family type such as GaAs, unlike the III-V family compound-semiconductor;

(b) It is difficult to control the growth of a semiconductor layer on a substrate. As a result, many defects develop in the semiconductor layers, particularly, near the interface with a substrate, then a carrier concentration is low; and (c) The defects are generated by the current application.

SUMMARY OF THE INVENTION

The present invention was made with the view toward overcoming the aforementioned problems such as low luminescence efficiency, low yield, and no applicability to a laser diode, accompanied by conventional semiconductor optoelectric devices employing a sapphire substrate.

An object of the present invention is to provide a semiconductor optoelectric device having a high luminescence efficiency and to provide a method of manufacturing the same. Another object of the present invention is to provide a laser diode using a sapphire substrate.

The semiconductor optoelectric device of the present invention comprises:

a polygonal monocrystalline substrate of a hexagonal close-packed structure, oriented in <0001> axis, and having a polygonal peripheral area, individual sides of said polygonal monocrystalline substrate are substantially parallel to a <11-20> axis;

compound-semiconductor layers deposited on the polygonal monocrystalline substrate; and electrodes connected to the compound-semiconductor layers.

According to a preferable embodiment of the semiconductor optoelectric device of the present invention, the polygonal monocrystalline substrate is a parallelogram.

Furthermore, the semiconductor optoelectric device of the present invention comprises:

a polygonal monocrystalline substrate of a hexagonal close-packed structure, oriented in <0001> axis, and having a polygonal peripheral area, one side of said polygonal monocrystalline substrate is substantially parallel to <11-20> axis, another side of said polygonal monocrystalline substrate is substantially parallel to <1-100> axis, a longest side of said polygonal monocrystalline substrate is at least twice as long as a thickness of the polygonal monocrystalline substrate, and a surface roughness of a back surface of said polygonal monocrystalline substrate falls within 10% of the thickness of said polygonal monocrystalline substrate;

compound-semiconductor layers deposited on the monocrystalline substrate; and electrodes connected to the compound-semiconductor layers.

According to another preferable embodiment of the present invention, the polygonal monocrystalline substrate is a rectangle or square.

The hexagonal close-packed structure monocrystalline substrate may be made of sapphire, zinc oxide, silicon carbide and the like. The compound-semiconductor may be made of an element selected from the group consisting of a lanthanide series element, an actinide series element, In, Ga, Al, B, Tl, Y, and Sc, in coupled with an element selected from the group consisting of N, As, P, Sb and Bi.

According to a still another preferable embodiment of the semiconductor optoelectric device of the present invention, the compound-semiconductor is a hexagonal close-packed structure.

According to a further preferable embodiment of the semiconductor optoelectric device, one of the compound-semiconductor layers is a hexagonal close-packed structure containing nitrogen.

The method of manufacturing the semiconductor optoelectric device of the present invention comprises the steps of:

depositing compound-semiconductor layers on a hexagonal close-packed structure monocrystalline substrate oriented in <0001) axis;

connecting electrodes to the compound-semiconductor layers; and cutting the monocrystalline substrate provided with the compound-semiconductor layers into polygonal chips individual sides of which are substantially parallel to a <11-20> orientation.

Furthermore, the method of manufacturing the semiconductor optoelectric device of the present invention comprises the steps of:

preparing the hexagonal close-packed structure monocrystalline substrate oriented in <0001 axis such that the surface roughness of a back surface of the monocrystalline substrate falls within 10% of the thickness thereof;

depositing compound-semiconductor layers on the hexagonal close-packed structure monocrystalline substrate;

connecting electrodes to the compound-semiconductor layers; and cutting the monocrystalline substrate provided with the compound-semiconductor layers into polygonal chips such that a side is substantially parallel to a <11-20> orientation;

another side is substantially parallel to a <1-100> orientation; and the longest side is at least twice as long as the thickness of the monocrystalline substrate.

Moreover, the semiconductor optoelectric device of the present invention comprises:

a substrate;

semiconductor layers deposited on the substrate; and electrode connected to at least one of the semiconductor layers, wherein, the substrate has an opening extending from the back surface of the substrate into the semiconductor layer;

an area of the smallest horizontal cross section of the opening provided to the substrate is smaller than that of the opening provided to the semiconductor layer; and the electrodes are formed so as to be contact with the semiconductor layer through the opening of the substrate.

FIG. 1 is an illustration showing a direction for cutting the semiconductor optoelectric device according to the present invention.

In FIG. 1, on a hexagonal close-packed structure monocrystalline substrate 11 oriented in <0001> axis, compound-semiconductor layers 12 are deposited. An arrow shows a <11-20> orientation. The monocrystalline substrate 11 provided with the compound-semiconductor layers 12 is cut along the <11-20> orientation, thereby manufacturing polygonal chips.

According to the present invention, the semiconductor optoelectric device are obtained by cutting the hexagonal close-packed structure monocrystalline substrate into polygonal chips in such a way that individual sides of the polygonal chips are parallel to the <11-20> orientation. In this manner, the monocrystalline substrate can be desirably cut without the application of an excessive force. This is because the hexagonal close-packed structure crystalline has a characteristic natural cleavage line of cutting along the <11-20> orientation. This fact was found by the present inventors. As a result, a physical influence due to the cutting, such as crystallizability degradation, can be reduced and a luminescent efficiency is improved. In addition, preferable advantages such as improvement in the yield and a long life, will be offered to the semiconductor optoelectric device.

The laser diodes obtained by the application of the method of the present invention will have flatter cleaved planes than before and generate desirable laser oscillation.

Besides the aforementioned advantages, the present invention entails the following advantages.

In the case of manufacturing a semiconductor optoelectric device, light emitting from the upper surface of the compound-semiconductor layers, the present invention contributes to minimizing a light-emitting area occupied by electrodes since the electrodes can be provided in the vicinity of vertices having an interior angle of 60°.

In the case of an LED of edge emission type, the present invention contributes to improving light output therefrom, namely, external quantum efficiency. This is because the total side length, which is responsible for light emission, of the polygonal compound semiconductor layers of the present invention is longer than that of a square and a rectangular one, assuming that they have the same surface area.

Most desirably, the polygon is a parallelogram, however, an equilateral triangle or a polygon the interior angles of which are a multiple of 60° may be used. Even if each side of the polygon is off the <11-20> orientation by ±3° or less, the monocrystalline substrate can be desirably cleaved.

According to the findings by the present inventors, if the thickness of the monocrystalline substrate and the surface roughness of the back surface thereof satisfy predetermined conditions, the hexagonal close-packed structure monocrystalline substrate can be also cleaved well in the <1-100> orientation. To describe more specifically, if the thickness of the monocrystalline substrate is less than half of the longest side of the polygon chips and if the back surface of the monocrystalline substrate is polished in such a way that the surface roughness of the back surface falls within 10% of the substrate thickness, the substrate can be cleaved well along the <1-100> orientation.

As shown in FIG. 2A, the monocrystalline substrate having an unpolished back surface is liable to be fractured with low energy application along various orientations including the <11-20> and <1-100> orientations. Therefore, it is difficult to cleave the monocrystalline substrate along only the <1-100> orientation. In contrast, when the back surface is polished as shown in FIG. 2B, the monocrystalline substrate is cleaved distinctively along the <11-20> and <1-100> orientations. To reiterate, if the thickness and the roughness of the back surface of the hexagonal close-packed structure monocrystalline substrate satisfy the predetermined conditions mentioned above, the monocrystalline substrate can be cleaved along the directions shown in FIG. 3. Note that it is not necessary to polish an entire back surface but may be effective if a desired cutting area is partially polished.

Average roughness Rz of 10 points arbitrarily chosen from the back surface of the monocrystalline substrate is desirably 10 μm or less. More desirably, the average roughness Ra along the center line of the back surface of the monocrystalline substrate is 10 μm or less. When a laser diode is manufactured by setting Ra at 10 μm or less, the laser threshold (Jth) of generating laser oscillation can be drastically lowered, as shown in FIG. 4.

Such surface roughness corresponds with that of the back surface of the monocrystalline substrate polished so as to have a light permeability of 50% or more when a light of 500 nm in wavelength is applied.

The polishing of the back surface offers not only an advantage of the cleavage along the <11-20> and <1-100> orientations but also another advantages. One of the advantages, which is observed in the case of a laser diode, is that light reflected from the substrate has decreased. As a result, a laser oscillation mode becomes stable. In the case of an LED, since the smooth and flat cleaved plane reduces light scattering and light absorption with the aid of the polished back-surface, light output will be maintained at the same level even if a small chip is used.

The invention set forth in claim 25 is concerned with a structure of a semiconductor optoelectric device comprising compound-semiconductor layers deposited on a predetermined chemical compound substrate, both of which belongs to a different chemical family. More specifically, the invention relates to the semiconductor optoelectric device comprising a chemical compound substrate made of a III-V family such as GaAs and compound-semiconductor layers of a II-VI family, such as ZnSe, grown on the substrate. However, such a semiconductor optoelectric device has a problem with putting into practice since lattice matching is hardly attained between the substrate and the semiconductor layers.

The present inventors devised an opening extending from the back surface of a substrate to the semiconductor layer of such a semiconductor optoelectric device and then an electrode is provided through the opening so as to be contact to the semiconductor layer. As a result, they found that such a construction ensures an improvement in a luminescence efficiency and high reliability, low-voltage operation and high-temperature operation. When the opening is provided, the semiconductor layers may be partially removed.

When many defects, which are produced by the different lattice constant between the substrate and the semiconductor layers, are present in semiconductor layers near the interface with a substrate, if the opening is formed, the defects can be effectively removed. As a result, an electrode can be directly provided on a defect-free crystalline portion of the semiconductor layers. In the semiconductor optoelectric device thus constructed, since a current is not flow through the area near the interface with the substrate having many defects, the reliability will be improved and operating voltage can be reduced. Moreover, defects will not be generated by current application. If an electrode having a low heat-resistance is used, the semiconductor optoelectric device obtained will be improved in temperature characteristics besides high reliability, low operation voltage, and high operation temperature. Since an electrode is formed directly in the semiconductor layer, a current is not dispersed in the substrate. This structure of the semiconductor optoelectric device can therefore serves as a current-flow confinement structure.

BRIEF DESCRIPTION OF THE DRAWINGS

FIG. 23 is a cross-sectional view of the laser diode of a ninth embodiment of the present invention; and FIG. 24 is a profile showing the relationship between an effective acceptor density and a depth of an opening in the laser diode of the ninth embodiment according to the present invention.

DETAILED DESCRIPTION OF THE PREFERRED EMBODIMENTS (Embodiment 1)

The processes of manufacturing an LED according to a first embodiment of the present invention are shown in FIGS. 5 to 10.

Figure 1:
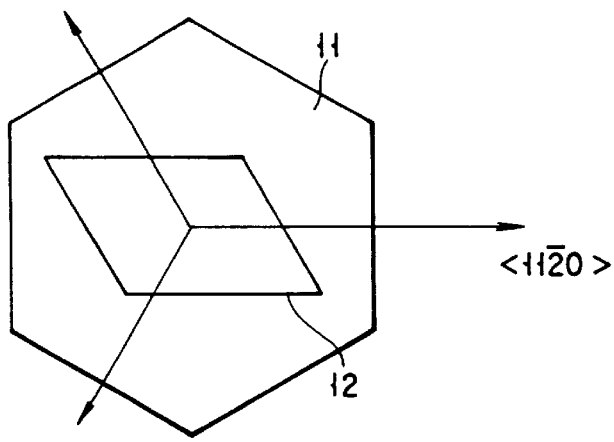
FIG. 1 is an illustration showing a direction of cutting the semiconductor optoelectric device of the present invention.
Figure 2A:
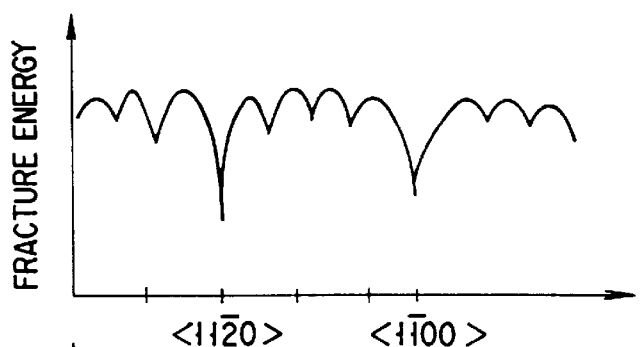
FIGS. 2A and 2B show the relationship between the fracture energy of a monocrystalline substrate and a cutting direction (FIGS. 2A and 2B show the cases where a back surface of a substrate is not polished and polished, respectively)
Figure 2B:
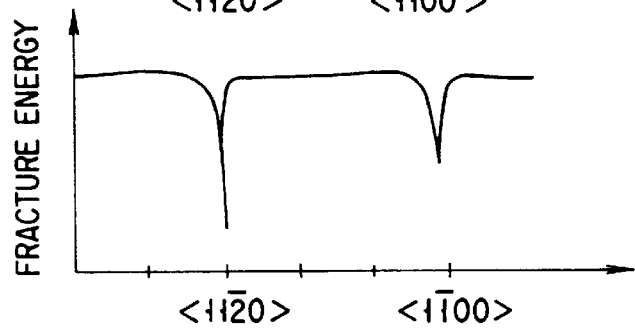
Figure 3:
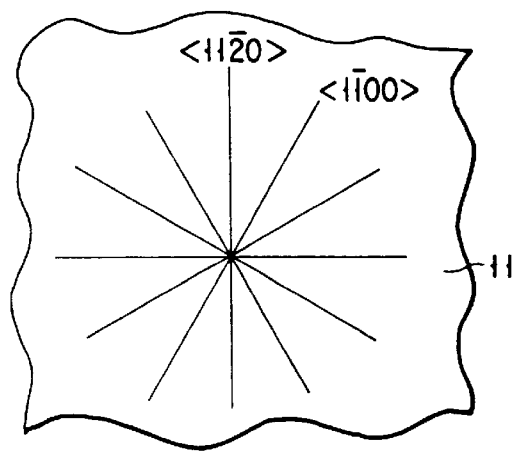
FIG. 3 is an illustration showing cleavage directions of the monocrystalline substrate having a back surface polished.
Figure 4:
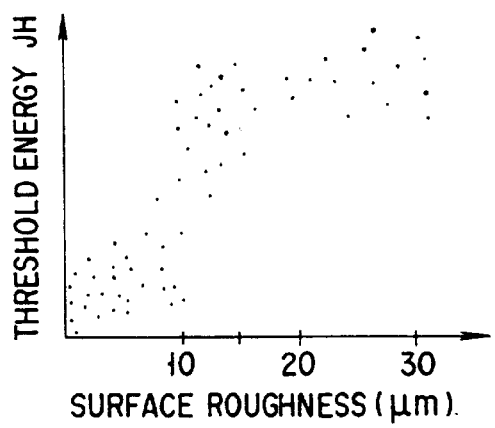
FIG. 4 is a distribution profile showing the relationship between a surface roughness (Ra) of a back surface of a substrate and a laser threshold (Jth) of a laser oscillation.
Figure 5A:
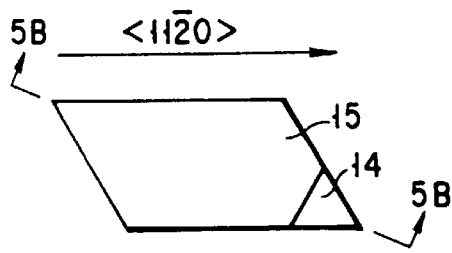
FIGS. 5A and 5B are a top plan view and a cross-sectional view of part of a semiconductor optoelectric device, respectively, for explaining a manufacturing method of the LED according to a first embodiment of the present invention.
Figure 6:
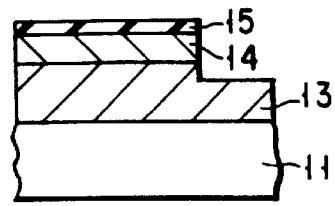
FIG. 6 is a view of part of a semiconductor optoelectric device for explaining a manufacturing method of an LED according to the first embodiment of the present invention.
Figure 5B:
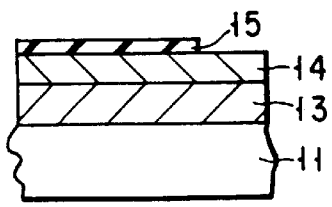

In the first place, a 100 μm-thick substrate 11 made of sapphire is prepared, as shown in FIG. 5B. On the substrate 11, 3 μm-thick n-type GaN layer 13 is deposited by an MOCVD method (metal organic chemical vapor deposition) or an MBE method. On the n-type GaN layer 13, 0.8 μm-thick p-type GaN layer 14 is further deposited in the same manner using the MOCVD or MBE method. Subsequently, on the layer 14, a $SiO_2$ layer 15 is formed by a sputtering method. The $SiO_2$ layer may be substituted by a $SiN_x$ layer.

Thereafter, on the $SiO_2$ layer 15, a photoresist (not shown) is coated. To the photoresist is applied a parallelogram pattern having a missing portion in the vicinity of one of two vertices having the interior angle of 60° (shown in FIGS. 5A and 8). The photoresist with a pattern is exposed to light and developed. Individual sides of the parallelogram are parallel to the <11-20> orientation of the substrate 11. After the pattern is developed, etching is carried out using hydrofluoric acid (or using dry etching method) and the pattern is formed on the $SiO_2$ layer 15. By the etching, the upper surface of the p-type GaN layer 14 in the vicinity of the vertex mentioned above is partially exposed, as shown in FIG. 5B which is a cross sectional view along the section line A–B shown in FIG. 5A. Thereafter, etching is applied to the exposed portion of the layer 14 using phosphoric acid. In this manner, the upper surface of the n-type GaN layer 13 corresponding to the exposed portion of the layer 14 is also exposed.

Figure 7A:
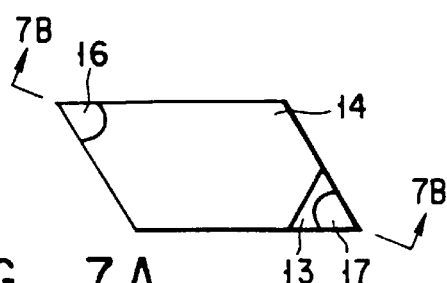
FIGS. 7A and 7B are a top plan view and a cross-sectional view of part of a semiconductor optoelectric device, respectively, for explaining a manufacturing method of the LED according to the first embodiment of the present invention.
Figure 7B:
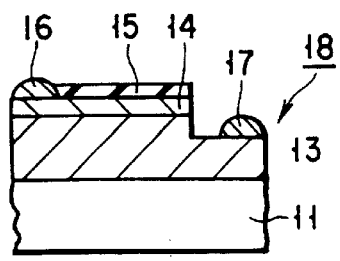

Afterward, a photoresist (not shown) is coated, another pattern is applied having a missing portion in the vicinity of the other vertex having an interior angle of 60° diagonally positioned to the vertex mentioned above. After the photoresist is exposed to light and developed, an exposed portion of the layer 15 is removed by etching using hydrofluoric acid. As a result, the upper portion of the p-type GaN layer 14 is partially exposed, as shown in FIG. 7A. To the exposed portion thus obtained, an AuNi electrode 16 and to the previously exposed portion of the n-type GaN layer 13, an AlTi electrode 17 is provided, as shown in FIG. 7B which is a cross-sectional view taken along the line A–B of the top plan view shown in FIG. 7A. In this manner, LEDs 18 aligned on the sapphire substrate 11 are prepared.

Figure 8:
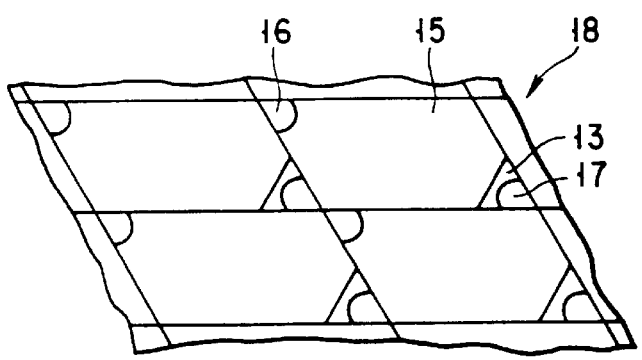
FIG. 8 is a top view of part of a semiconductor optoelectric device for explaining a manufacturing method of the LED according to the first embodiment of the present invention.

On the LEDs 18 aligned on the substrate, scribe lines are provided by a needle-scriber along parallelogram patterns formed on the aligned LEDs 18, as shown in FIG. 8. The resultant structure is cut along the scribe lines to obtain individual pieces of LEDs 18.

Figure 10:
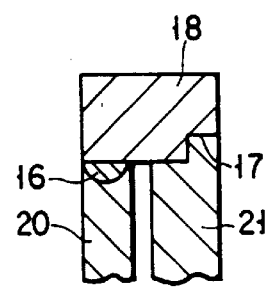
FIG. 10 is an illustration of another LED mounted on electrodes, according to the first embodiment of the present invention.
Figure 9:
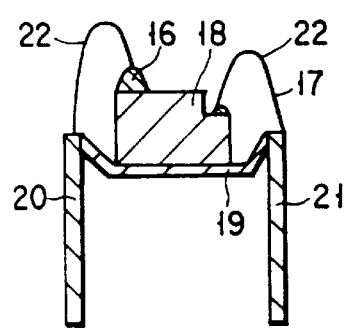
FIG. 9 is an illustration of an LED mounted on a reflecting plate, according to the first embodiment of the present invention.

Examples of the LED 18 mounting are shown in FIGS. 9 and 10. In FIG. 9, the LED 18 is mounted on a reflecting plate 19. Electrodes 16 and 17 formed on the LED 18 are respectively connected to external electrodes 20 and 21 positioned around the reflecting plate 19 by way of lead wires 22. In FIG. 10, the LED 18 is directly mounted on the external electrodes 20 and 21. The electrodes 16 and 17 formed on the LED 18 are directly connected to the external electrodes 20 and 21 without using a lead wire.

The LED of the present invention shown in this embodiment can be cut by one/tenth of force required for conventional LED using a sapphire substrate. As a result, the substrate cleavage imposes no physical influence on LED. In other words, the degree of crystallization is not lowered, with the result that the LED will be improved in an luminescent efficiency.

Since the electrodes are formed near vertices having an interior angle of 60°, the ratio of the area occupied by the electrodes relative to the upper surface area of the p-type GaN layer 14 responsible for light-emission is low in the LED of the present invention, compared to conventional LEDs having electrodes near vertices having an interior angle of 90°. Therefore, a light output of the LED is improved.

By virtue of the advantages mentioned above, the LED of the present invention described in this embodiment is improved in brightness by 30% or more, in life by 50% or more, and in yield by 90% or more. It should be noted that the yield of the conventional LED is about 50%.

(Embodiment 2)

Figure 11:
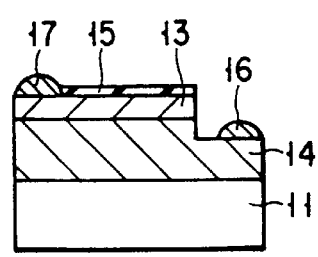
FIG. 11 is a cross-sectional view of the LED according to a second embodiment of the present invention.

A second embodiment of the LED according to the present invention is shown in FIG. 11. FIG. 11 is a cross-sectional view of the LED taken along the line A–B and substantially the same as shown in FIG. 5A. In this embodiment, on a sapphire substrate 11, a p-type GaN layer 14 and an n-type GaN layer 13 are sequentially formed. The LED of Embodiment 2 is different from that of Embodiment 1 only in the order of layers 13 and 14. In Embodiment 2, the same advantages as in Embodiment 1 were successfully obtained.

(Embodiment 3)

Figure 12:
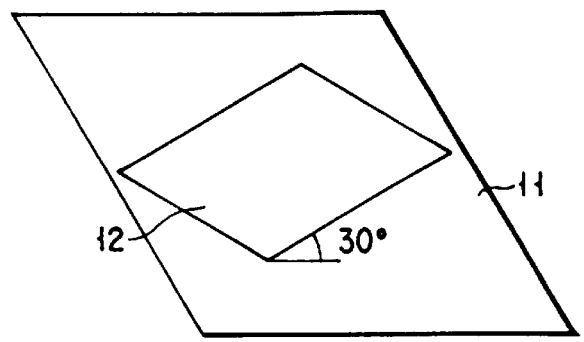
FIG. 12 is a plan view of the LED according to a third embodiment of the present invention.

A third embodiment of the LED according to the present invention is shown in FIG. 12. FIG. 12 is a top plan view of a chip. In the Embodiment 3, a parallelogram cleaving pattern of a substrate 11 does not match with that of a compound-semiconductor 12 formed on the substrate 11. More specifically, the pattern of the compound-semiconductor 12 is disposed so as to be inclined to the substrate 11 by an angle of 30°. This structure is formed in a photolithography patterning step of the compound-semiconductor 12. That is, the patterning is made so as to be inclined to the <11-20> orientation of the substrate 11 by an angle of 30°.

In Embodiment 3, the same advantages as in Embodiment 1 were successfully obtained.

(Embodiment 4)

Figure 13A:
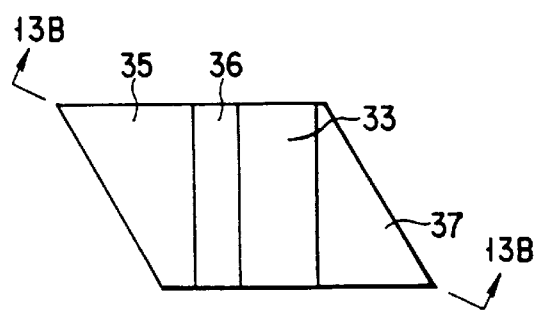
FIGS. 13A and 13B are a top plan view and a cross sectional view, respectively, showing the laser diode of a first embodiment according to the present invention.
Figure 13B:
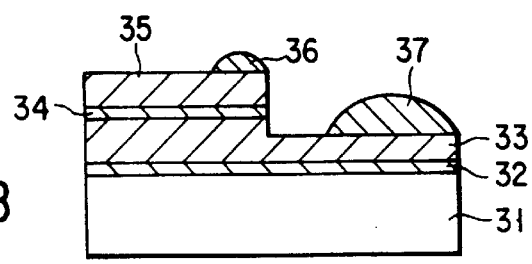

A first embodiment of the laser diode according to the present invention is shown in FIGS. 13A and 13B. FIG. 13A is a top plan view of the laser diode. FIG. 13B is a cross-sectional view along the line A–B shown in FIG. 13A.

As shown in FIG. 13B, on a 100 μm-thick sapphire substrate 31, 0.02 μm-thick InGaN buffer layer 32, 3 μm-thick n-type AlGaN layer 33, 0.1 μm-thick GaN active layer 34, and 0.5 μm-thick p-type AlGaN layer 35 are sequentially formed. As shown in FIG. 13A, a half area of the layer 33 including a vertex having an interior angle of 60° is exposed. On the layer 35, an AuNi electrode zone 36 is formed on the p-type AlGaN layer 35. On the layer 33, an AlTi electrode 37 is formed.

Hitherto, attempts have been made to manufacture laser diodes by using a sapphire substrate. However, the chips obtained by cutting along scribe lines were difficult to generate laser oscillation. In contrast, the laser diode of this embodiment was confirmed to generate laser oscillation at a threshold of 20 mA.

(Embodiment 5)

Figure 14A:
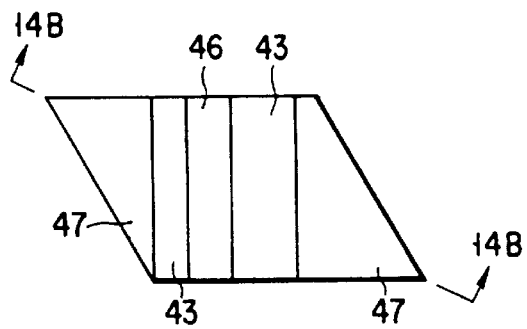
FIGS. 14A and 14B are a top plan view and a cross sectional view, respectively, showing the laser diode of a second embodiment according to the present invention.
Figure 14B:
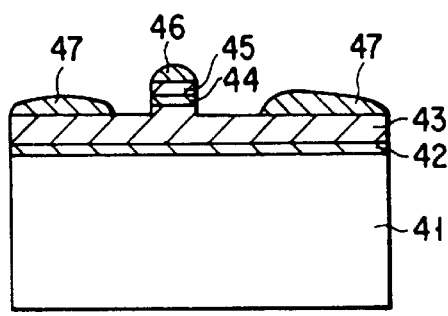

A second embodiment of the laser diode according to the present invention is shown in FIGS. 14A and 14B. FIG. 14A is a top plan view of the laser diode. FIG. 14B is a cross-sectional view along the line A–B shown in FIG. 14A.

As shown in FIG. 14B, on a 100 μm-thick sapphire substrate 41, 0.02 μm-thick InGaN buffer layer 42, 3 μm-thick n-type AlGaN layer 43, 0.1 μm-thick GaN active layer 44, and 0.5 μm-thick p-type AlGaN layer 45 are sequentially formed. As shown in FIG. 14A, two portions including a vertex (an interior angle of 60°) of the layer 43 are exposed. On the central zone portion sandwiched between the two portions of the layer 43, the layer 45 is remained. On the entire upper surface of the layer 45 remained, an AuNi electrode zone 46 is formed. On each of the two portions of the layer 43, an AlTi electrode 47 is provided.

The laser diode of Embodiment 5 is improved in an optical confinement and current confinement, compared to the laser diode of Embodiment 4. As a result, it was confirmed to generate laser oscillation at a threshold 10 mA or less.

(Embodiment 6)

Figure 15A:
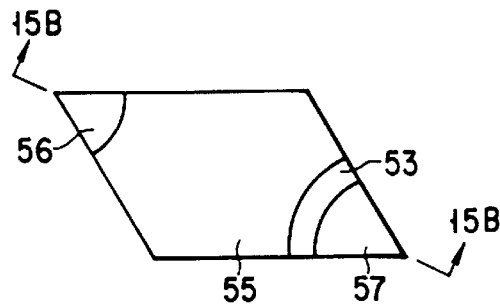
FIGS. 15A and 15B are a top plan view and a cross sectional view, respectively, showing the LED of a fourth embodiment according to the present invention.
Figure 15B:
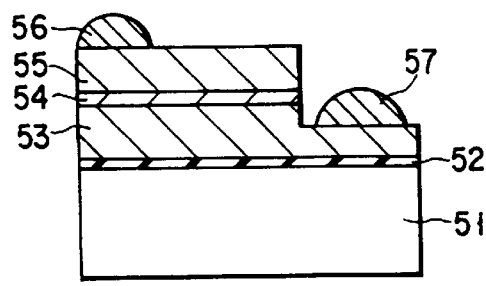

A fourth embodiment of the LED according to the present invention is shown in FIGS. 15A and 15B. FIG. 15A is a top plan view of the LED. FIG. 15B is a cross-sectional view along the line A–B shown in FIG. 15A.

As shown in FIG. 15B, on a 100 μm-thick ZnO substrate 51, 0.05 μm-thick AlN buffer layer 52, 4 μm-thick n-type AlInGaN layer 53, 0.1 μm-thick AlInGaN luminescent layer 54, and 0.2 μm-thick p-type AlInGaN layer 55 are sequentially formed.

From the portion in the vicinity of one of the two vertices (an interior angle of 60°) of the parallelogram thus formed, the layers 55 and 54 are removed. The resultant exposed layer 53 is etched half in depth. On the layer 55, an AuNi electrode 56 is provided. On the layer 53, an AlTi electrode 57 is provided as shown in FIG. 15B.

The LED of this embodiment is improved over the conventional LED, in the light output of the LED by 100% or more and in the life by 100%.

(Embodiment 7)

Figure 16A:
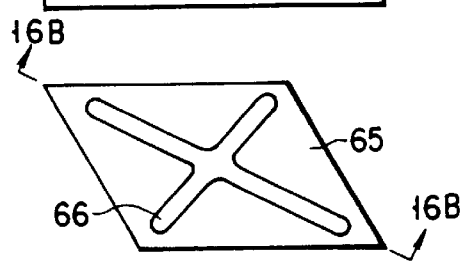
FIGS. 16A and 16B are a top plan view and a cross sectional view, respectively, showing the LED of a fifth embodiment according to the present invention.
Figure 16B:
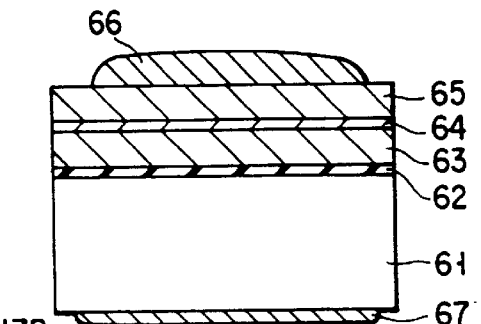

A fifth embodiment of the LED according to the present invention is shown in FIGS. 16A and 16B. FIG. 16A is a top plan view of the LED. FIG. 16B is a cross-sectional view along the line A–B shown in FIG. 16A.

As shown in FIG. 16B, on a 100 μm-thick SiC substrate 61, 0.05 μm-thick AlN buffer layer 62, 4 μm-thick n-type AlInGaN layer 63, 0.1 μm-thick AlInGaN luminescent layer 64, and 0.2 μm-thick p-type AlInGaN layer 65 are sequentially formed.

On the upper surface of the layer 65, an electrode 66 is provided in an X-letter form corresponding to the diagonal lines of the parallelogram. On the lower surface of the SiC substrate 61, an AlTi electrode 67 is provided.

Since etching is not required, unlike the LED of Embodiment 6, the LED of this embodiment can be manufactured in fewer steps. The LED of this embodiment was capable of emitting light in the same amount and had the same life as that of the LED in embodiment 6.

(Embodiment 8)

Figure 17A:
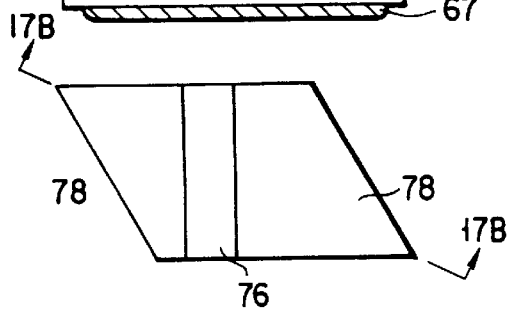
FIGS. 17A and 17B are a top plan view and a cross sectional view, respectively, showing the laser diode of a third embodiment according to the present invention.
Figure 17B:
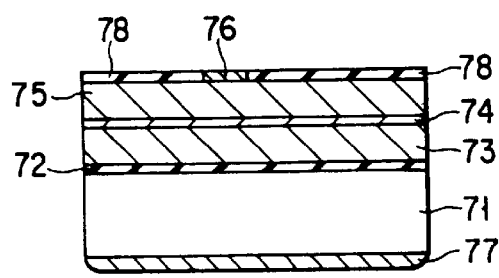

A third embodiment of the laser diode according to the present invention is shown in FIGS. 17A and 17B. FIG. 17A is a top plan view of the laser diode. FIG. 17B is a cross-sectional view along the line B—B shown in FIG. 17A.

As shown in FIG. 17B, on a 100 μm-thick SiC substrate 71, a 0.05 μm-thick AlN buffer layer 72, 4 μm-thick n-type AlInGaN layer 73, 0.1 μm-thick AlInGaN active layer 74, and 0.2 μm-thick p-type AlInGaN layer 75 are sequentially formed.

On the upper surface of the layer 75, an AuNi electrode zone 76 is provided near the center. On the upper surface of the layer 75 excluding the portion on which an electrode 76 is provided, a $SiO_2$ layer 78 is formed. On the other hand, on the lower surface of a SiC substrate 71, an AlTi electrode 77 is provided.

Since etching of the compound-semiconductor layers is not required, unlike the laser diodes of Embodiments 4 and 5, the LED of this embodiment is manufactured in fewer steps. The laser diode of this embodiment can generate laser oscillation at the same threshold as in Embodiment 4.

In the foregoing, we explained various embodiments of semiconductor optoelectric devices obtained by cutting the substrate along the <11-20> orientation. The aforementioned embodiments can be applied to the case where a substrate is cut along the <1-100> orientation.

Basic advantages of the present invention can be obtained by cutting a substrate in the <11-20> (or <1-100> orientation). Therefore, the shape of the semiconductor optoelectric devices is not always a parallelogram and may be an equilateral triangle, trapezoid, equilateral hexagon, and other polygons.

If the scribe line is deviated from the <11-20> orientation by an angle within ±3°, an excessively large force may not be required for cutting the substrate. As long as the deviation of the scribe line falls within the range, a substrate can be cut by such a scribing method.

If the chips are cut along scribe lines which are slightly off the <11-20> orientation, the "off-direction" can be corrected by etching the cleaved plane of the chips using phosphoric acid. As a result, the flat and vertically-cleaved planes can be obtained. Instead of the phosphoric acid etching, dry-etching may be employed using chlorine and boron chloride.

In place of the MOCVD method employed in the embodiments mentioned above, a CVD method and an MBE (molecular beam epitaxial growth) method may be employed.

The substrate preferably has a thickness of 30 to 500 μm, more preferably, 40–150 μm. This is because the substrate will be easily fractured if the thickness is less than 30 μm, and a large cleaving force will be required if the thickness is larger than 500 μm. As the result, the performance of the semiconductor optoelectric devices will be adversely affected.

Hereinbelow, we will describe embodiments of semiconductor optoelectric devices one side of which is cut along the <11-20> orientation and the other side of which is cut in the <1-100> orientation. In these cases, a rectangular semiconductor optoelectric devices are resulted.

(Embodiment 9)

Figure 18:
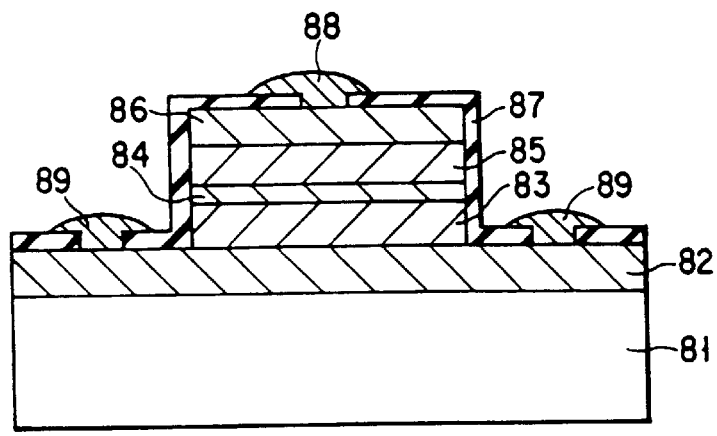
FIG. 18 is a top plan view and a cross sectional view, respectively, showing the laser diode of a fourth embodiment according to the present invention.

FIG. 18 is a cross-sectional view of a fourth embodiment of the laser diode according to the present invention.

As is shown in FIG. 18, on a sapphire substrate 81, an n-type GaN layer 82 and n-type AlGaN layer 83, an InGaN layer 84, a p-type AlGaN layer 85, and p-type GaN layer 86 are sequentially formed. On the resultant structure, a $SiO_2$ film is formed by a CVD method, plasma CVD method or sputtering method. To the $SiO_2$ film, a patterning is applied. The $SiO_2$ film except for an area zone parallel to the <1-100> orientation is removed. Using the $SiO_2$ film left on the zone area as a mask, the semiconductor layers 86 to 83 are removed by a wet etching using an alkali and RIE (reactive ion etching), or RIBE (reactive ion beam etching) until the layer 82 is exposed.

After the mask of the $SiO_2$ film is removed, a $SiO_2$ film 87 is formed over the upper surface of the layer 82 thus exposed, the side plane of semiconductor layers 86 to 83 which are exposed by etching, and the upper surface of the layer 86. In the $SiO_2$ film 87, opening zones are formed in parallel with the <1-100> orientation. Consequently, portions of the layers 82 and 86 are partially exposed. On the exposed layer 86 and the exposed layer 82, an Al/Ni electrode 88 and an Au/Pt/Ti electrode 89 are respectively provided.

Afterwards, the back surface of the sapphire substrate 81 is polished by diamond to form a mirror plane. The mirror plane can be prepared by wet etching using an acid (, or alkali, or dry etching such as RIE, or RIBE). The substrate having a mirror plane on the back side is then carefully cleaved into flat-plate chips of 1 mm×500 µm so as to have a length of 1 mm parallel to the opening zone, that is, in the <1-100> orientation.

The laser diode thus obtained showed a threshold of laser oscillation which is a half of that of the conventional laser diode.

(Embodiment 10)

Figure 19A:
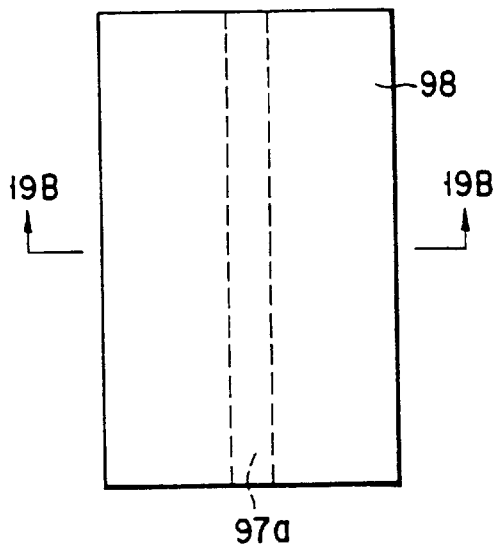
FIGS. 19A and 19B are a top plan view and a cross sectional view, respectively, showing the laser diode of a fifth embodiment according to the present invention.
Figure 19B:
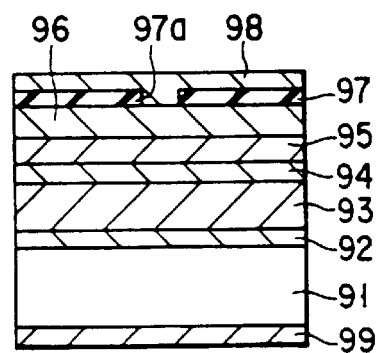

A fifth embodiment of the laser diode according to the present invention is shown in FIGS. 19A and 19B. FIG. 19A is a top plan view of the laser diode. FIG. 19B is a cross-sectional view along the line B—B shown in FIG. 19A.

As shown in FIGS. 19A and 19B, on a SiC substrate 91, an n-type GaN layer 92, an n-type AlGaN layer 93, an InGaN layer 94, a p-type AlGaN layer 95 and a p-type GaN layer 96 are sequentially formed. On the resultant structure, a $SiO_2$ film 97 is formed by the CVD method (, or plasma CVD method, or sputtering method). To the $SiO_2$ film, patterning is applied and an opening zone 97a is formed along the <1-100> orientation at the center of a chip pattern. In this manner, the layer 96 is partially exposed.

Afterwards, the back surface of the sapphire substrate 91 is polished by diamond to form a mirror plane. To the layer 96 exposed in the opening zone, an Al/Ni electrode 98 is provided. To the mirror plane on the back side of the substrate 91, an Au/Ti electrode 99 is provided.

In the same manner as in Embodiment 9, the substrate 91 is carefully cleaved into flat-plate chips of 1 mm×500 µm so as to have a length of 1 mm parallel to the opening zone, that is, in the <1-100> orientation.

The laser diode thus obtained showed a threshold of laser oscillation which is a half of that of the conventional laser diode.

(Embodiment 11)

Figure 20A:
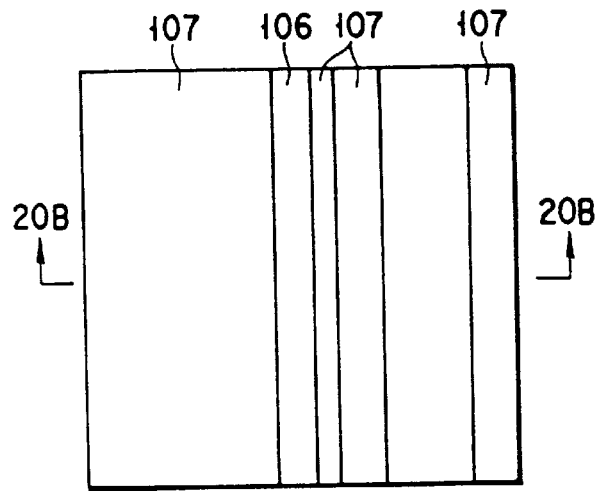
FIGS. 20A to 20C are a top plan view and a cross sectional view, respectively, showing the laser diode of a sixth embodiment according to the present invention.
Figure 20B:
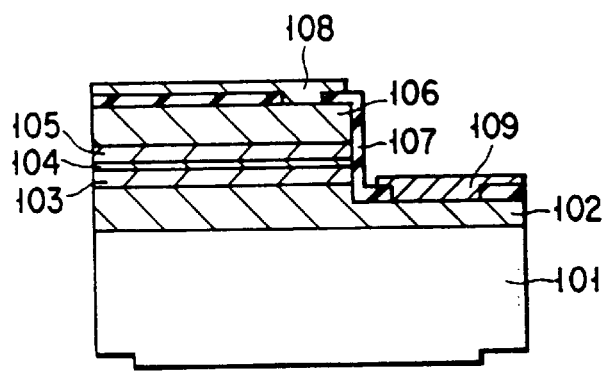
Figure 20C:
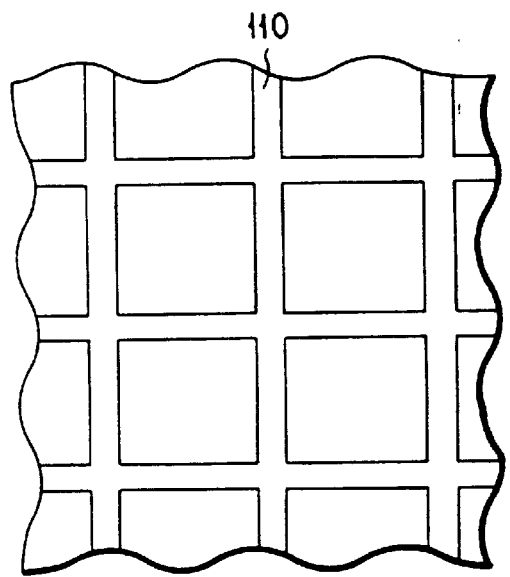

A sixth embodiment of the laser diode according to the present invention is shown in FIGS. 20 to 20C. FIG. 20A is a top plan view of the laser diode. FIG. 20B is a cross-sectional view along the line B—B shown in FIG. 20A. In FIG. 20B, an electrode is not shown.

As shown in FIGS. 20A to 20C, on a sapphire substrate 101, an n-type GaN layer 102, an n-type AlGaN layer 103, a GaN/InGaN/GaN stacked structure 104, a p-type AlGaN layer 105, and a p-type GaN layer 106 are sequentially formed. On the resultant structure, a $SiO_2$ film 107 is formed by the CVD method (, or plasma CVD method, or sputtering method). To the $SiO_2$ film, patterning is applied. Consequently, a half side of a pattern along the <1-100> orientation is exposed. Using the $SiO_2$ film as a mask, semiconductor layers 106 to 103 are removed by the wet etching using an alkali (, or by dry etching such as RIE, or RIBE) until the layer 102 is partially exposed.

Again, the $SiO_2$ film 107 is formed and then patterning is applied in the same manner as above. As a result, an opening zone is obtained along the <1-100> orientation, in which the layer 106 is partially exposed. To the exposed layers 106 and 102, an Al/Ni electrode 108 and an Au/Pt/Ti electrode 109 are respectively provided.

Afterwards, the back surface of the sapphire substrate 101 is polished along the boarder of chip patterns by diamond as shown in FIG. 20C. As a result, a mirror plane is obtained. The mirror plane can be obtained by the wet etching using an acid (, or alkali, or the dry etching such as RIE, or RIBE). In this case, it is further effective to make the mirror plane thinner than the periphery portion. The substrate 101 partially having a mirror plane is carefully cleaved into flat-plate chips of 1 mm×500 µm so as to have a length of 1 mm parallel to the opening zone, that is, in the <1-100> orientation, in the same manner as in Embodiment 9.

The laser diode thus obtained showed a threshold current which is a half of that of the laser diode to which no back-surface polishing is applied.

(Embodiment 12)

Figure 21A:
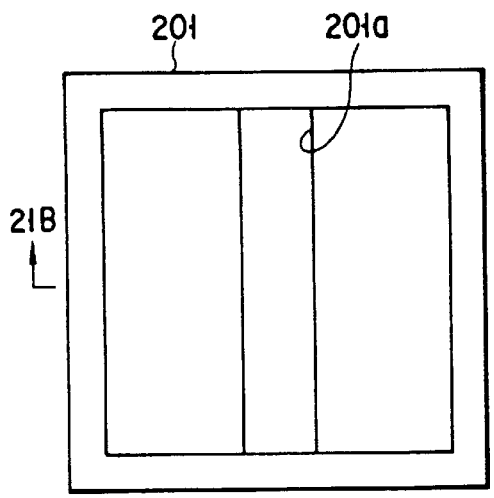
FIGS. 21A and 21B are a bottom plan view and a cross sectional view, respectively, showing the laser diode of a seventh embodiment according to the present invention.
Figure 21B:
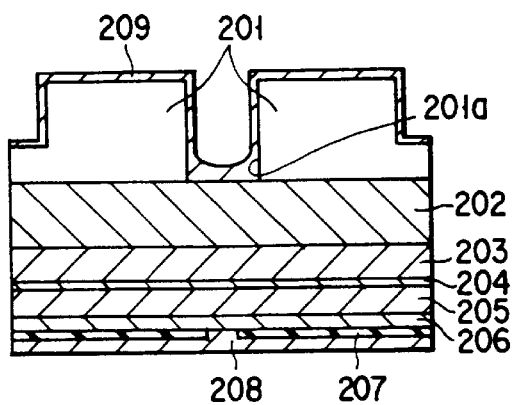

A seventh embodiment of the laser diode according to the present invention is shown in FIGS. 21A and 21B. FIG. 21A is a bottom plan view of the laser diode. FIG. 21B is a cross-sectional view along the line B—B shown in FIG. 21A. In FIG. 21A, an electrode is not shown.

As shown in FIG. 21, on a sapphire substrate 201, an n-type GaN layer 202, an n-type AlGaN layer 203, a GaN layer 204, a p-type AlGaN layer 205 and a p-type GaN layer 206 are sequentially formed. On the resultant structure, a $SiO_2$ film 207 is formed by the CVD method (, or plasma CVD method, or sputtering method). To the $SiO_2$ film 207, patterning is applied. As a result, an opening zone is formed along the <1-100> orientation, in which the layer 206 is partially exposed.

Afterwards, the back surface of the sapphire substrate 201 is polished along the boarder of chip patterns by diamond. In this manner a mirror plane is formed. The mirror plane can be obtained by the wet etching using an acid (, or alkali, or the dry etching such as RIE, or RIBE).

Subsequently, using the $SiO_2$ film as a mask, an opening zone 201a extending from the central back surface of the substrate to the layer 202 is formed. To the layer 206 exposed on the upper side, an Al/Ni electrode 208 is provided. To the layer 202 exposed to the bottom side by way of the opening 201a, an Al/Ti electrode 209 is provided.

The substrate is carefully cleaved into flat-plate chips of 1 mm×500 µm so as to have a length of 1 mm parallel to the opening zone, that is, in the <1-100> orientation, in the same manner as in Embodiment 9. In this case, if the chips are formed so as to have a length of 1 mm in the orientation of <11-20> the same effects can be obtained.

The laser diode thus obtained showed a threshold of laser oscillation which is a quarter of that of the conventional laser diode.

Hereinbelow, we will describe an embodiment recited in claim 25 of the present invention.

(Embodiment 13)

Figure 22A:
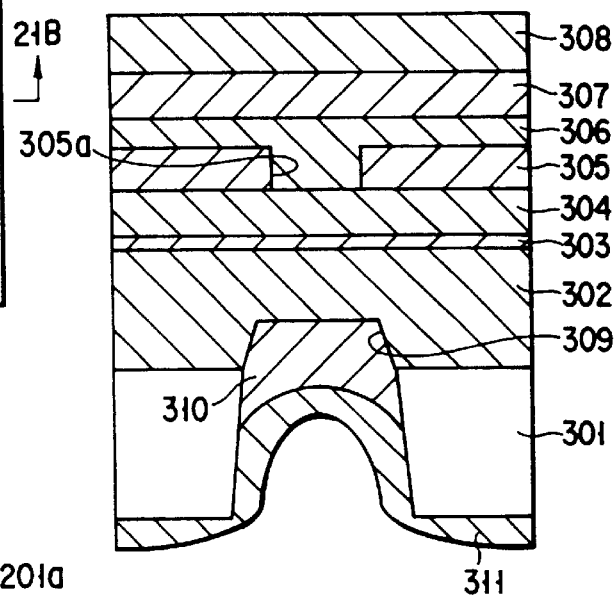
FIGS. 22A and 22B are a cross sectional view, and a bottom perspective view respectively, showing the laser diode of an eight embodiment according to the present invention.
Figure 22B:
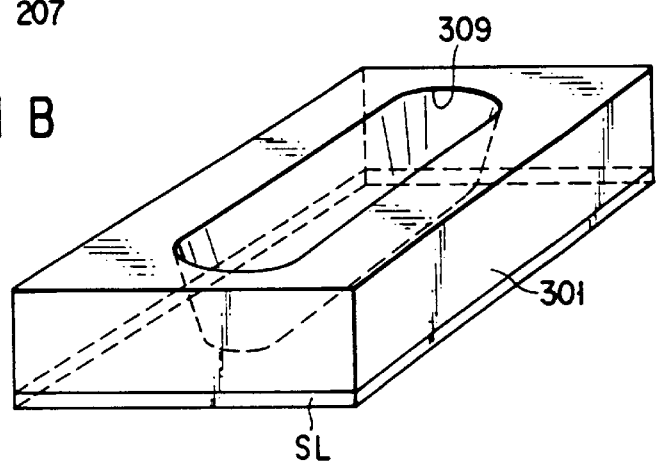

An eighth embodiment of the laser diode according to the present invention is shown in FIGS. 22A and 22B. FIG. 22A is a cross-sectional view of the laser diode. FIG. 22B is a perspective view observed from the bottom (an electrode is not shown).

As shown in FIGS. 22A and 22B, on a high resistivity GaAs substrate 301, a multi-heterolayer structure is formed which consists of a p-type ZnSe lower clad layer 302 (thickness: 2 μm, doping carrier concentration: 1E18 cm$^{-3}$), a CdZnSe/ZnSe quantum-well active layer 303, and an n-type upper clad layer 304 (thickness: 0.5 μm, doping carrier concentration: 1E18 cm$^{-3}$). The multi-heterolayer structure serves as a light emitting portion.

On the upper clad layer 304, a p-type current-blocking layer 305 (thickness: 1 μm, doping carrier concentration: 1E18 cm$^{-3}$) are formed. In the layer 305 is formed an opening 305a in which the layer 304 is exposed. On the current blocking layer 305, an n-type ZnSe layer 306 (thickness: 3 μm, a doping carrier concentration: 1E18 cm$^{-3}$) is formed so as to be contact with the upper clad layer 304 through the opening 305a. On the layer 306, an n-type ZnSe capping layer 307 (thickness: 500 μm, doping carrier concentration: 1E19 cm$^{-3}$) is formed. Furthermore, over the entire layer 307, an n-electrode 308 is provided. The electrode 308 is formed by laying a Ti layer (10 nm), Pt (50 nm) layer, and Au layer (300 nm), sequentially.

From the bottom surface of the substrate 301 into the layer 302, a slot-form opening 309 is provided as shown in FIG. 22B in which a set of layers 301–307 is designated as "SL". Since the opening 309 is extended into the layer 302, the layer 302 is partially removed near the interface with the substrate 301. To the inner surface of the opening 309, a CuSe electrode 310 is provided so as to be contact with the layer 302. A Pd/Au electrode 311 is provided over the entire back surface of the substrate 301 and over the CuSe electrode 310. In the structure thus constructed, since a current is not applied to an edge surface, the degradation of the edge surface serving as a reflecting plate can be suppressed. As a result, the reliability can be improved.

To explain the manufacturing steps of the aforementioned structure more specifically, the laser diode is formed as follows: in the first place, to clean a surface of the substrate 301, the temperature of a wafer is raised up to about 550° C. to 650° C. for 5 minutes under a vacuum of 1E-8 Torr or less. By this process, contaminants present on the surface, such as an oxide film, can be removed. The removal of the contaminants was confirmed by the RHEED observation.

Thereafter, layers 302, 303, 304 to 305 are sequentially grown by the MBE method applied at 300° C. Nitrogen is used as a p-type dopant and chlorine as an n-type dopant. Then, a wafer is taken out from an MBE growing furnace and subjected to photolithography and etching in a bromine-series solution. Through this step, an opening 305a is formed extending from the layer 305 to the layer 304.

Afterwards, the resultant wafer is placed in the MBE growth furnace, layers 306 and 307 are formed at 250° C. After the wafer is taken out from the furnace, again, the n-electrode 308 is formed over the entire surface of the wafer. After Au is vapor-deposited onto the back surface of the GaAs substrate 301, the wafer is adhered on a glass plate by applying wax on the n-electrode 308 side. Then, the vapor-deposited Au is etched by means of photography in couple with a KI-series etching solution to prepare a mask for forming a slot-form opening 309. Using the mask, the GaAs substrate is etched by use of an etching solution containing NaOH and $H_2O_2$ in a ratio of 5 to 1. Since the etch rate to ZnSe is slow, etching stops at the ZnSe lower clad layer 302. After the layer 302 is partially etched by use of a bromine-series etching solution, CuSe is allowed to grow in an aqueous solution to form the CuSe electrode 310. Finally the Pd/Au electrode 311 is formed.

The laser diode thus constructed as shown in FIG. 22 is cleaved into chips in such a way that the cavity length is 500 μm. The obtained chip is mounted onto a heat sink made of copper with an In solder. The properties of the laser diode is evaluated at room temperature. As a result, an oscillation wavelength was 525 nm. The threshold current required for continuous operation was 40 mA. The operation voltage was 5.75V. A maximum temperature during the continuous wave operation was 120° C.

As is apparent from the above results, by providing an opening extending from the back surface of the substrate to the ZnSe lower clad layer, continuous wave operation, which is difficult in the prior art, is successfully attained at room temperature. In addition, laser oscillation can be made at the temperature ensuring sufficient reliability. Actually, it is confirmed that the continuous wave operation of the laser diode for 10,000 hours or more can be made at an operation temperature of 70° C., under an operation power of 5 mW.

The sufficient reliability is attained for the reason that the opening extending from the back surface of the substrate to the semiconductor layer is provided to the semiconductor optoelectric device comprising the substrate made of a III-V family compound-semiconductor and semiconductor layers made of a II-VI family compound-semiconductor. This is because (a) defects present in the semiconductor layers near the interface with the substrate are removed;

(b) factors affecting to degrade properties are eliminated by forming electrodes so as to be directly contact we semiconductor layers; and (c) The generation of defects is suppressed in the semiconductor layers near the interface with the substrate, in comparison with a case where a current indirectly flows into the semiconductor layers via the substrate. Consequently, the defects are prevented from being extended into a light-emitting portion.

Since a current density is improved by virtue of a current confinement structure obtained in the semiconductor optoelectric device according to the present invention, operation can be carried out under low voltage. Furthermore, since a current does not flow into the edge surface of the semiconductor layers, degradation of the edge surface is lowered. In addition, since the presence of metal used as electrodes contributes to a good heat radiation element, the semiconductor optoelectric device can efficiently and effectively radiate heat.

(Embodiment 14)

A ninth embodiment of the laser diode according to the present invention is shown in FIG. 23.

As shown in a cross-sectional view (FIG. 23), on a p-type GaAs substrate 401 is formed a multi-heterolayer structure comprising an insulating ZnSe buffer layer 402 (thickness: 0.2 μm, doping carrier concentration: 1E16cm$^{-3}$ or less), an n-type ZnSSe lower clad layer 403 (thickness: 0.2 μm, doping carrier concentration: 1E18cm$^{-3}$ or less), a CdZnSe/ZnSe quantum well active layer 404, and a p-type upper clad layer 405 (thickness: 0.5 μm, doping carrier concentration: 1E18 cm$^{-3}$). The multi-heterolayer structure serves as a light-emitting portion.

On the upper clad layer 405, an n-type ZnSSe current-blocking layer 406 (thickness: 1 μm, doping carrier concentration: 1E18 cm$^{-3}$) is formed. In the layer 406, an opening 406a is provided in which the upper clad layer 405 is partially exposed. On the layer 406 and in the opening 406a, a p-type ZnSSe layer 407 (thickness: 3 μm, dopting carrier concentration: 1E18 cm$^{-3}$) is formed so as to be contact with the layer 405. On the layer 407, a p-type ZnSSe cap layer 408 (thickness: 500 nm, doping carrier concentration: 1E19cm$^{-3}$) is formed. Further, over the entire surface of the cap layer 408, a p-electrode is provided. The p-electrode is formed by laying a Pd (50 nm) layer and an Au (300 nm) layer one on top of the other.

To the substrate 401 is provided an opening 410 of a slot form which extends from the back surface of the substrate 401 into a lower portion of the layer 403 through the layer 402. Since the opening 410 is formed, the layer 402 and the lower portion of the layer 403 are partially removed.

An etch rate to the layers 402 and 403 is higher than that to the substrate 401. As a result, the horizontal cross-sectional area of the opening 410 in the layer 402 is larger than that of the opening in the layer 401.

On the back surface of the layer 401 including the inner surface of the opening 410, an n-type electrode 411 is formed. The n-type electrode is formed by laying an In layer (10 nm) and an Au layer (300 nm) sequentially on the layer 403.

In the laser diode thus constructed, good properties were obtained in the same way as in Embodiment 13.

As is described in the above, by providing the opening such that the horizontal cross sectional area of the opening formed in the semiconductor layers contact with the substrate is larger that of the opening 410 formed in the substrate 401, electrodes can be tightly connected to the semiconductor body. For example, when element In is employed as an electrode, interior stress generated in the cooling step after the In is deposited and heated, is successfully absorbed by the larger opening of the semiconductor layers. As a result, element In tightly adheres on the surface of the semiconductor layers. On the other hand, since the In electrode layer is not deposited on the side walls of the buffer layer 402 and the lower clad layer 403 formed by etching, it is advantageous that a leak current path is not formed extending to the interface with the substrate.

FIG. 24 shows distribution of the effective acceptor density in the vicinity of the interface between a p-type GaAs substrate and a p-type ZnSe layer. As shown in FIG. 24, the effective acceptor density of the p-type ZnSe layer is low near the interface with the p-type GaAs substrate. In this condition, when the semiconductor optoelectric device is operated, voltage significantly drops near the interface between the p-type ZnSe layer and the substrate. As a result, the operation voltage of the semiconductor optoelectric device increases. However, since such a portion having a low effective acceptor density is removed by forming an opening according to the semiconductor optoelectric device of the present invention and therefore an electrode can be directly formed on the p-type ZnSe layer, an operation voltage can be lowered.

In the foregoing, embodiments of laser diode recited in claim 25 have been explained referring to FIGS. 22 to 24. However, the present invention will not be limited to the aforementioned embodiments. The present invention can be applied to semiconductor optoelectric devices and heterobipolar transistors comprising a III-V family compound-semiconductor substrate and II-VI family compound-semiconductor layers. In these cases, high reliability can be ensured. In this case, as substrates, use may made of silicate, sapphire, SiC, SrTiO$_2$, diamond and the like. As the group III-V compound-semiconductor for use in the semiconductor layers formed on a substrate, use may be made of GaN, InGaN, AlGaN, BN, AlN and the like.

What is claimed is:

1. A method of manufacturing a semiconductor optoelectric device comprising the steps of:

depositing compound-semiconductor layers on a monocrystalline substrate of a hexagonal close-packed structure;

connecting electrodes to the compound-semiconductor layers; and cutting said monocrystalline substrate provided with the compound-semiconductor layers into polygonal chips individual sides of which are substantially parallel to a <11-20> orientation.

2. The method of manufacturing a semiconductor optoelectric device according to claim 1, wherein said monocrystalline substrate is one selected from the group consisting of sapphire, zinc oxide and silicon carbide.

3. The method of manufacturing a semiconductor optoelectric device according to claim 1, wherein the shape of said monocrystalline substrate is a parallelogram.

4. A method of manufacturing a semiconductor optoelectric device comprising the steps of:

preparing a monocrystalline substrate of hexagonal close-packed structure such that the surface roughness of a back surface of the monocrystalline substrate falls within 10% of the thickness thereof;

depositing compound-semiconductor layers on said monocrystalline substrate;

connecting electrodes on said compound-semiconductor layers; and cutting said monocrystalline substrate provided with said compound-semiconductor layers into polygonal chips such that individual sides are substantially parallel to a <1-100> orientation or <11-20> orientation; and the longest side is at least twice as long as the thickness of said monocrystalline substrate.

5. The method of manufacturing a semiconductor optoelectric device according to claim 4, wherein said monocrystalline substrate is one selected from the group consisting of sapphire, zinc oxide and silicon carbide.

6. The method of manufacturing a semiconductor optoelectric device according to claim 4, wherein the shape of said monocrystalline substrate is a parallelogram.

7. A method of manufacturing a semiconductor optoelectric device comprises the steps of:

preparing a monocrystalline substrate of the hexagonal close-packed structure such that the surface roughness of a back surface of the monocrystalline substrate falls within 10% of the thickness thereof;

depositing compound-semiconductor layers on said monocrystalline substrate;

connecting electrodes to said compound-semiconductor layers; and cutting said monocrystalline substrate provided with said compound-semiconductor layers into polygonal chips such that a side is substantially parallel to a <11-20> orientation;

another side is substantially parallel to a <1-100> orientation; and the longest side is at least twice as long as the thickness of the monocrystalline substrate.

8. The method of manufacturing a semiconductor optoelectric device according to claim 7, wherein said monocrystalline substrate is one selected from the group consisting of sapphire, zinc oxide and silicon carbide.

9. The method of manufacturing a semiconductor optoelectric device according to claim 7, wherein the shape of said monocrystalline substrate is a rectangle or a square.

10. A method of manufacturing a laser diode comprising the steps of:

depositing compound-semiconductor layers on a monocrystalline substrate of a hexagonal close-packed structure;

connecting electrodes to the compound-semiconductor layers; and cutting said monocrystalline substrate provided with the compound-semiconductor layers into polygonal chips individual sides of which are substantially parallel to a <11-20> orientation.

11. The method of manufacturing a laser diode according to claim 10, wherein said monocrystalline substrate is one selected from the group consisting of sapphire, zinc oxide and silicon carbide.

12. The method of manufacturing a laser diode according to claim 10, wherein the shape of said monocrystalline substrate is a parallelogram.

13. The method of manufacturing a laser diode according to claim 10, wherein the laser diode is an edge emission type.

14. A method of manufacturing a laser diode comprising the steps of:

preparing a monocrystalline substrate of hexagonal close-packed structure such that the surface roughness of a back surface of the monocrystalline substrate falls within 10% of the thickness thereof;

depositing compound-semiconductor layers on said monocrystalline substrate;

connecting electrodes on said compound-semiconductor layers; and cutting said monocrystalline substrate provided with said compound-semiconductor layers into polygonal chips such that individual sides are substantially parallel to a <1-100> orientation or <11-20> orientation, and the longest side is at least twice as long as the thickness of said monocrystalline substrate.

15. The method of manufacturing a laser diode according to claim 14, wherein said monocrystalline substrate is one selected from the group consisting of sapphire, zinc oxide and silicon carbide.

16. The method of manufacturing a laser diode according to claim 14, wherein the shape of said monocrystalline substrate is a parallelogram.

17. The method of manufacturing a laser diode according to claim 14, wherein the laser diode is an edge emission type.

18. A method of manufacturing a laser diode comprises the steps of:

preparing a monocrystalline substrate of the hexagonal close-packed structure such that the surface roughness of a back surface of the monocrystalline substrate falls within 10% of the thickness thereof;

depositing compound-semiconductor layers on said monocrystalline substrate;

connecting electrodes to said compound semiconductor layers; and cutting said monocrystalline substrate provided with said compound-semiconductor layers into polygonal chips such that a side is substantially parallel to a <11-20> orientation, another side is substantially parallel to a <1-100> orientation, and the longest side is at least twice as long as the thickness of the monocrystalline substrate.

19. The method of manufacturing a laser diode according to claim 18, wherein said monocrystalline substrate is one selected from the group consisting of sapphire, zinc oxide and silicon carbide.

20. The method of manufacturing a laser diode according to claim 18, wherein the shape of said monocrystalline substrate is a rectangle or a square.

21. The method of manufacturing a laser diode according to claim 18, wherein the laser diode is an edge emission type.

* * * * *